United States Patent [19]

Miyaji et al.

[11] Patent Number: 5,559,584
[45] Date of Patent: Sep. 24, 1996

[54] EXPOSURE APPARATUS

[75] Inventors: Akira Miyaji; Masatoshi Ikeda, both of Tokyo, Japan

[73] Assignee: Nikon Corporation, Tokyo, Japan

[21] Appl. No.: 380,447

[22] Filed: Jan. 30, 1995

Related U.S. Application Data

[63] Continuation of Ser. No. 206,168, Mar. 7, 1994, abandoned.

[30] Foreign Application Priority Data

| Mar. 8, 1993 | [JP] | Japan | 5-046519 |
| Mar. 8, 1993 | [JP] | Japan | 5-046520 |

[51] Int. Cl.$^6$ .................................................. G03B 27/34
[52] U.S. Cl. ........................... 355/73; 355/53; 355/67; 355/76
[58] Field of Search ........................ 355/30, 53, 67, 355/73, 76

[56] References Cited

U.S. PATENT DOCUMENTS

| 4,564,284 | 1/1986 | Tsutsui | 355/30 |
| 4,699,505 | 10/1987 | Komoriya et al. | 355/30 |
| 4,716,299 | 12/1987 | Tanaka et al. | 250/571 |
| 4,748,477 | 5/1988 | Isohata et al. | 355/53 |
| 4,749,867 | 6/1988 | Matsushita et al. | 355/67 |
| 4,786,947 | 11/1988 | Kosugi et al. | 355/30 |
| 4,803,524 | 2/1989 | Ohno et al. | 355/53 |
| 4,820,930 | 4/1989 | Tsutsui et al. | 250/548 |
| 4,998,134 | 3/1991 | Isohata et al. | 355/53 |
| 4,999,671 | 3/1991 | Iizuka | 355/97 |
| 5,003,342 | 3/1991 | Nishi | 355/53 |
| 5,025,284 | 6/1991 | Komoriya et al. | 355/53 |
| 5,184,196 | 2/1993 | Nakagawa et al. | 356/401 |

*Primary Examiner*—Michael L. Gellner
*Assistant Examiner*—D. P. Malley
*Attorney, Agent, or Firm*—Shapiro and Shapiro

[57] ABSTRACT

An exposure apparatus is for illuminating a pattern on a mask by an illumination optical system to transfer the pattern on the mask onto a photosensitive substrate set on a stage through a projection optical system. The exposure apparatus comprises a first supply device for supplying an inert gas toward the photosensitive substrate substantially in parallel with the optical axis of the projection optical system in a space open to communicate with the atmosphere between the projection optical system and the photosensitive substrate, and a second supply device for supplying the inert gas to the space in a direction intersecting with the optical axis of the projection optical system so as to establish an inert gas atmosphere in the space together with the first supply device. The transfer is conducted in the inert gas atmosphere.

24 Claims, 5 Drawing Sheets

EXPOSURE APPARATUS

This is a continuation of application Ser. No. 08/206,168 filed Mar. 7, 1994, now abandoned.

BACKGROUND OF THE INVENTION

1. Field of the Invention

The present invention relates to an exposure apparatus. More particularly, the invention relates to an exposure apparatus having a light source such as an excimer laser, a harmonic laser or a mercury lamp, which emits ultraviolet rays, particularly a spectral beam overlapping with an absorption spectrum of oxygen.

2. Related Background Art

The lithography process for producing semiconductor elements or liquid crystal boards has been employing an exposure apparatus for exposure of an image of pattern on a reticle (e.g., photomask), on a photosensitive substrate through a projection optical system. A recent trend is to develop finer semiconductor integrated circuits. It is thus considered for the lithography process that a method for decreasing the exposure wavelength of the lithography light source is employed as means for enabling formation of finer patterns.

Presently, already developed is an exposure apparatus employing a KrF excimer laser of wavelength 248 nm as a stepper light source. Attention is being given as candidates of shorter wavelength light sources to harmonics of wavelength-variable lasers such as a Ti-sapphire laser, a fourth harmonic of YAG laser of wavelength 266 nm, a fifth harmonic of YAG laser of wavelength 213 nm, a mercury lamp of wavelength near 220 nm, or 184 nm, an ArF excimer laser of wavelength 193 nm, etc.

If an exposure apparatus employs a conventional light source, for example, the g-line, the i-line, the KrF excimer laser, or a mercury lamp emitting light of wavelength near 250 nm, an emission spectrum of such light source never overlaps with an absorption spectral region of oxygen as shown in FIG. 6. Therefore, the oxygen absorption neither lowered the light utilization factor nor caused production of ozone in that case. Accordingly, such exposure apparatus permitted exposure basically in the atmosphere.

A light source such as the ArF excimer laser, however, has an emission spectral band overlapping with the absorption spectral region of oxygen as shown in FIG. 6, so that the oxygen absorption lowers the light utilization factor and causes a problem due to generation of ozone. For example, suppose the transmittance of an ArF excimer laser beam is 100%/m in vacuum or in inert gas such as nitrogen or helium. Then the transmittance in the atmosphere is about 90%/m for free run condition (spontaneous emission state) or for an ArF wide band laser, while about 98%/m even for an ArF narrow band laser with a narrowed spectral band as shown avoiding the absorption lines of oxygen.

It is considered that the decrease in transmittance is caused by absorption of light by oxygen and influence of produced ozone. Not only does the produced ozone negatively affect the transmittance (light utilization factor), but also degrades the performance of apparatus because of the reaction with the surface of optical material or other components, or causes environmental pollution.

It is well known that the entire optical path must be filled with inert gas such as nitrogen to avoid the decrease in transmittance of light or the generation of ozone in the exposure apparatus having a light source such as the ArF excimer laser. An exposure apparatus is generally composed of an illumination optical system for uniformly illuminating a reticle with light from a light source, a projection optical system for focusing a circuit pattern formed on a reticle, on a wafer, and stage means for supporting the wafer and properly moving it for positioning.

In case of the exposure apparatus with the above-described structure, the optical path from the light source to a final optical member (e.g., a lens) in the projection optical system was hermetically concealed in a receptacle filled with inert gas, or each of the illumination optical system, the reticle and the projection optical system was hermetically concealed in a receptacle filled with inert gas.

Since the illumination optical system and the projection optical system each are basically constructed as a stationary unit, the inert gas atmosphere will never be broken in the specific exposure projection process once the inert gas atmosphere is established.

The stage means, however, requires frequent exchange of wafers. Further, the wafer stage must be always two-dimensionally moved to transfer the circuit pattern onto a plurality of exposure areas in a wafer. Thus, if the entire region of from the end portion of projection optical system to the stage means is confined in a receptacle filled with inert gas, the receptacle becomes large in scale and complex. Also, the inert gas atmosphere is broken every exchange of wafers, which requires a considerable time to again establish a desired inert gas atmosphere and which in turn lowers the throughput.

In addition, the inert gas atmosphere is also broken every exchange of reticles in the reticle area, which also needs a considerable time to again establish the desired inert gas atmosphere after evacuation and introduction of inert gas, lowering the throughput. In case a plurality of reticles are used for a single wafer, the frequency of reticle exchange becomes higher so as to further lower the throughput.

Further, there are a lot of members related to alignment of reticle, for example, alignment sensors, around a reticle table on which the reticle is mounted, which could cause a fluctuation of gas flow with re-introduction of inert gas to change an index of refraction of the atmosphere. The index change could induce an alignment error in turn. Therefore, after the re-introduction of inert gas, the alignment of the reticle must wait until the atmosphere is settled, which requires an additional time to re-form the desired inert gas atmosphere.

In case of the conventional exposure apparatus, a material for a reticle case is easily charged and the charge moves to the reticle. This caused such a problem that static electricity appeared on the reticle and the circuit pattern formed on the reticle could be easily broken due to the static electricity.

SUMMARY OF THE INVENTION

The present invention has been accomplished taking the above problems into consideration. Object of the present invention are to provide an exposure apparatus improved in throughput, in which stage means for a photosensitive substrate is not confined in a receptacle and exposure can be performed in a desired inert gas atmosphere formed by supplying an inert gas to a space between a final optical member in a projection optical system and the photosensitive substrate, and to provide an exposure apparatus in which a reticle can be exchanged for another reticle without breaking the inert gas atmosphere, and more preferably which can remove the static electricity appearing on the reticle to avoid damaging the reticle.

In the present invention, achieving the above objects, an exposure apparatus for transferring a pattern on a mask onto a photosensitive substrate through a projection optical system comprises first supply means for supplying an inert gas toward the photosensitive substrate substantially in parallel with the optical axis of the projection optical system and to a space open to communicate with the atmosphere formed between the projection optical system and the photosensitive substrate, and second supply means for supplying an inert gas to the space in a direction intersecting with the optical axis of the projection optical system, in which the transfer is carried out in the inert gas atmosphere.

In a preferred embodiment of the present invention, the second supply means supplies the inert gas in the direction perpendicular to the optical axis of the projection optical system. More preferably, the second supply means supplies the inert gas radially toward the optical axis of projection optical system.

In the present invention, achieving the above objects, another exposure apparatus for transferring a pattern on a mask onto a photosensitive substrate through a projection optical system comprises a first chamber for hermetically housing a first mask to be projected, first supply means for supplying an inert gas to said first chamber, exchange means for exchanging the first mask for a second mask to be next exposed, a second chamber for hermetically housing the second mask, second supply means for supplying an inert gas to said second chamber, and open and close means for interrupting or permitting communication between the first chamber and the second chamber.

In a preferred embodiment of the present invention, the exchange means is set in the second chamber, and is provided with a first arm for carrying a first mask into the second chamber and a second arm for carrying a second mask to be exchanged into the first chamber. Alternatively, the exchange means may be set in the second chamber, and may have an arm for carrying a mask between said first chamber and said second chamber, and a table for a mask to be mounted thereon is provided in the second chamber.

In case an exposure apparatus has an exposure wavelength in the ultraviolet region, the attenuation of exposure light and the generation of ozone can be prevented by filling the entire optical path with an inert gas having no absorption spectrum in the exposure wavelength region.

In the present invention, the inert gas is supplied toward the exposure area of the wafer substantially in parallel with the optical axis of the projection optical system or perpendicular to the exposure area, and the inert gas is also supplied horizontally or in directions substantially parallel with the wafer surface from a plurality of proper locations over the wafer stage.

This arrangement permits the air in the space formed between the end portion of the projection optical system and the wafer to be replaced by the inert gas at high substitution rate, and exposure is carried out in the inert gas atmosphere.

In the present invention, the charge on the wafer can be removed by supplying an inert gas containing ions or an ionized inert gas, whereby the wafer can be prevented from being damaged. In case the ions are produced by an ionizer, electrodes used for electric discharge may emit heavy metal, which could contaminate the wafer surface. In contrast, if the inert gas to be supplied is nitrogen, the nitrogen can be ionized utilizing the two-photon absorption with ultraviolet rays, whereby the charge on the wafer can be removed without contaminating the wafer surface by heavy metal.

In the present invention, an exposure apparatus with exposure wavelength in the ultraviolet region is provided with a first chamber for hermetically housing a first reticle to be subjected to projection exposure, and a second chamber adjacent to the first chamber. For example, a mechanical open and close mechanism (shutter) is provided between the first and the second chambers. Connected to each chamber are an exhaust system such as a vacuum pump and a feed system of inert gas. A reticle carrying mechanism is set in the second chamber while holding a second reticle to be next subjected to the projection exposure in a stand-by state.

As described above, the exposure apparatus of the present invention has the two independent chambers which can be hermetically closed. A desired inert gas atmosphere can be formed independently in each chamber. In exchanging reticles, the shutter mechanism between the first chamber and the second chamber is first opened to make communication between the first chamber and the second chamber. Then the reticle carrying mechanism is activated to exchange the first reticle for the second reticle. After the reticles are exchanged, the shutter mechanism is closed to interrupt the communication between the first chamber and the second chamber. Since the first chamber and the second chamber both are filled with the inert gas, the inert gas atmosphere in the first chamber will never be broken in the above steps. Also, the gas flow is minimum upon carrying of reticles in the first chamber, so that a change in index of refraction of the atmosphere due to the gas flow can be substantially avoided. Thus, the alignment of a reticle can be made immediately. Accordingly, the next projection exposure can be started immediately after the reticle exchange.

During projection exposure of the second reticle thus exchanged, the reticle carrying mechanism is activated to exchange the first exposed reticle left in the second chamber for a third reticle to be next subjected to projection exposure. On this occasion the inert gas atmosphere in the second chamber is broken, but the desired inert gas atmosphere can be re-established utilizing a time before the projection exposure is completed on the second reticle thus exchanged.

Also, if the ionized inert gas is arranged to be supplied into the second chamber, static electricity on the reticle carried into the second chamber can be removed and charging of the reticle can be prevented in the stand-by state, preventing a circuit pattern formed on the reticle from being damaged. If the inert gas atmosphere properly ionized is established in the second chamber, the ionized inert gas flows into the first chamber in making communication between the first chamber and the second chamber for reticle exchange. Charging of a reticle can be thus prevented in the first chamber, preventing the reticle from being damaged.

DETAILED DESCRIPTION OF THE PREFERRED EMBODIMENTS

The embodiments of the present invention will be described in detail with reference to the accompanying drawings.

Figure 1:
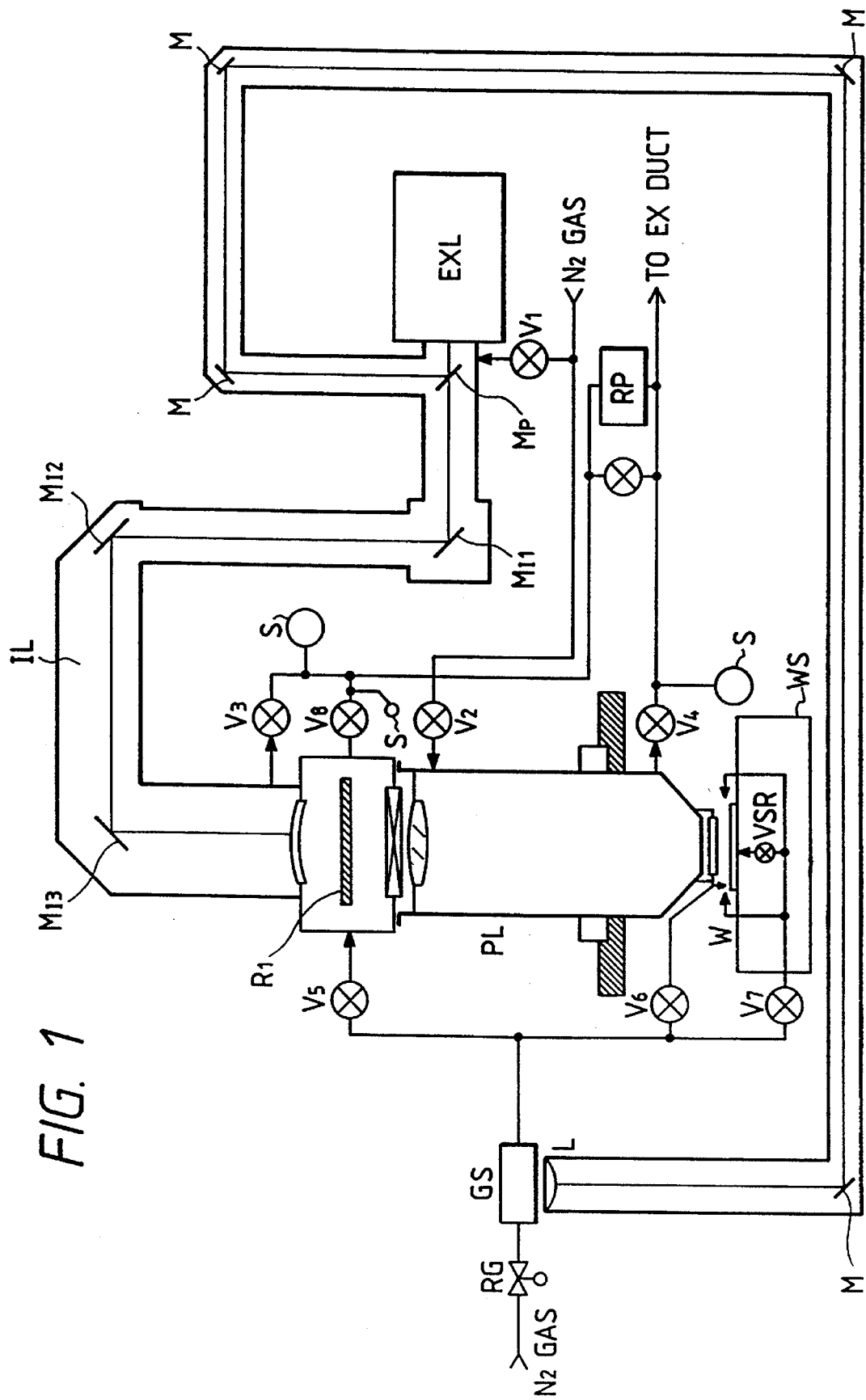
FIG. 1 is a drawing to schematically illustrate the structure of an exposure apparatus in an embodiment of the present invention.

FIG. 1 is a drawing to schematically illustrate the structure of an exposure apparatus in an embodiment of the present invention. The apparatus as shown is provided with a light source EXL emitting a short wavelength laser beam such as an ArF excimer laser, for example. A part of laser beam emitted from the light source EXL passes through a beam splitter (partial mirror) Mp, while the rest is reflected thereby. The light passing through the beam splitter Mp is then reflected by mirrors $M_{f1}$, $M_{f2}$ and $M_{f3}$ to uniformly illuminate a reticle R1 through an appropriate illumination optical member. An optical path from the light source EXL to the reticle R1 constitutes an illumination optical system IL. The illumination optical system IL is concealed in a receptacle, and the receptacle is so arranged that an inert gas, for example, nitrogen gas, is supplied through a valve V1 into the receptacle.

The light passing through the reticle R1 is led through various optical members constituting a projection optical system PL to impinge onto a surface of wafer W mounted on a wafer stage WS as forming an image of a pattern on the reticle R1. The projection optical system PL is also concealed in a receptacle, and nitrogen gas is supplied through a valve V2 into the receptacle.

The receptacle enclosing the illumination optical system IL communicates with an exhaust duct through a valve V3, an oxygen sensor S and a rotary pump RP. Also, the receptacle enclosing the projection optical system PL communicates with the exhaust duct through a valve V4, an oxygen sensor S and the rotary pump RP.

Figure 2:
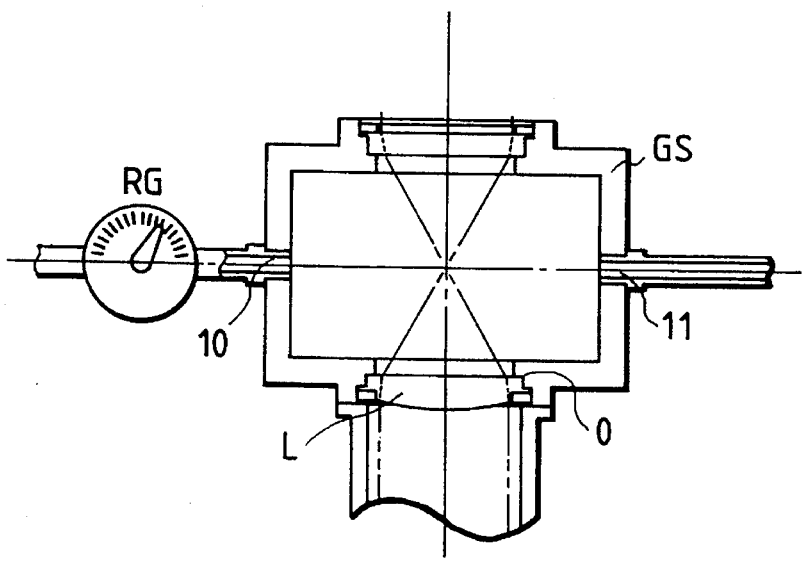
FIG. 2 is a cross sectional view to show the structure of a gas cell used in the apparatus of FIG. 1.

The light emitted from the light source EXL and then reflected by the beam splitter Mp is reflected by a plurality of mirrors M properly arranged, and then enters a gas cell GS through a lens L. The gas cell GS is arranged to receive a supply of nitrogen gas through a pressure reducing valve RG. As shown in detail in FIG. 2, an orifice O is formed in the gas cell GS and a lens L is arranged to seal the orifice O. The light enters the gas cell GS through the lens L to be focused on the axis connecting between a gas feed port 10 and a gas exhaust port 11. Then the nitrogen gas is ionized in the gas cell GS by the two-photon absorption effect by the ultraviolet light.

The ionized nitrogen gas discharged from the gas cell GS is supplied into a receptacle surrounding the reticle R1 through a valve V5. The receptacle surrounding the reticle R1 communicates with the exhaust duct through a valve V8, an oxygen sensor S and the rotary pump RP. The ionized nitrogen gas discharged from the gas cell GS is also supplied to the wafer stage WS through a valve V7 at the lower end portion of projection optical system PL.

Figure 3:
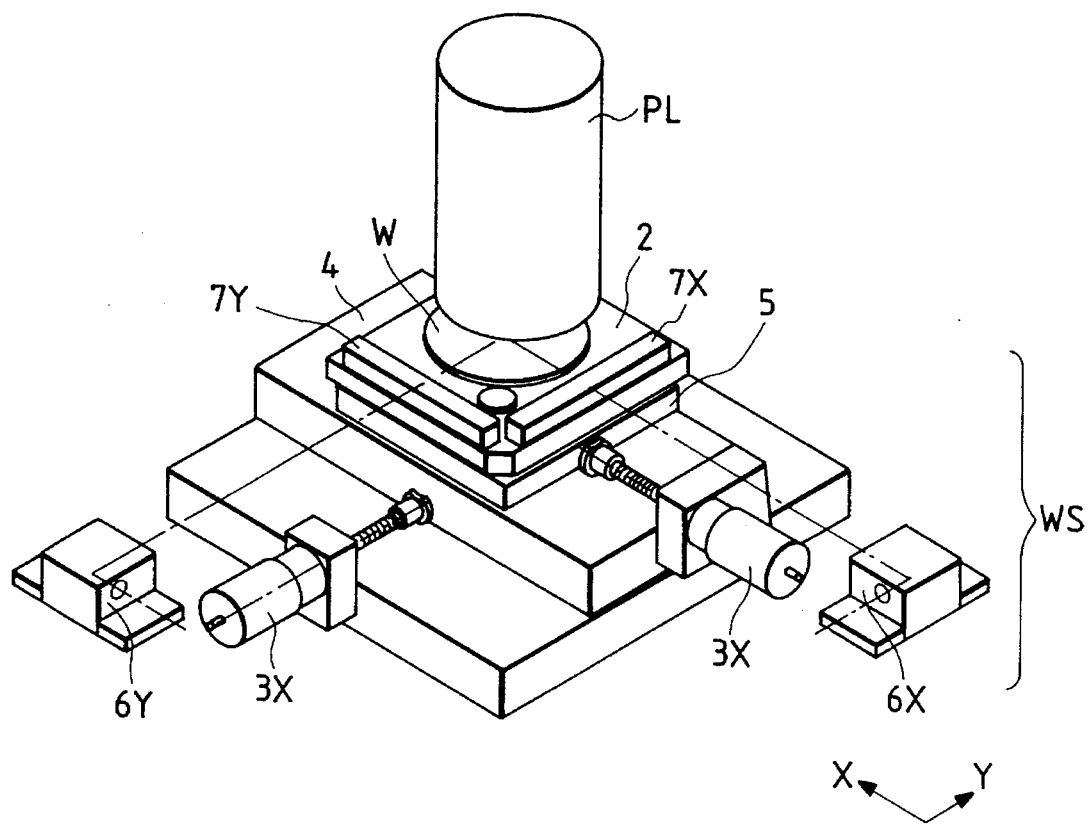
FIG. 3 is a perspective view to schematically show the structure of a projection optical system and a wafer stage.

FIG. 3 is a perspective view to schematically show the structure of the projection optical system PL and the wafer stage WS. A wafer W is mounted on the wafer table 2 at a constant clearance to the projection optical system PL and is perpendicular to the optical axis thereof. There are an X-direction interference mirror 7X and a Y-direction interference mirror 7Y provided along two mutually perpendicular sides on the square wafer table 2. The X-direction interference mirror 7X and the Y-direction interference mirror 7Y are arranged to reflect light from interferometer units 6X and 6Y opposed thereto, respectively. Each interferometer unit 6X, 6Y detects a moving amount of the wafer table 2 with a certain resolution from the reflected light, whereby positional information of the wafer W can be obtained.

The wafer table 2 is mounted on an X stage 5, and the X stage 5 can be moved back and forth by a driving mechanism 3X in the X direction. Also, the X stage 5 and the driving mechanism 3X are mounted on a Y stage 4, and the Y stage 4 can be moved back and forth by a moving mechanism 3Y in the Y direction. Further, the Y stage 4 and the moving mechanism 3Y are mounted on a base. Thus, the wafer stage mechanism WS is constructed as a whole of the wafer table 2, the X stage 5, the driving mechanism 3X, the Y stage 4, the driving mechanism 3Y, the X-direction interference unit 6X, the Y-direction interference unit 6Y, the X-direction interference mirror 7X and the Y-direction interference mirror 7Y.

Figure 4A:
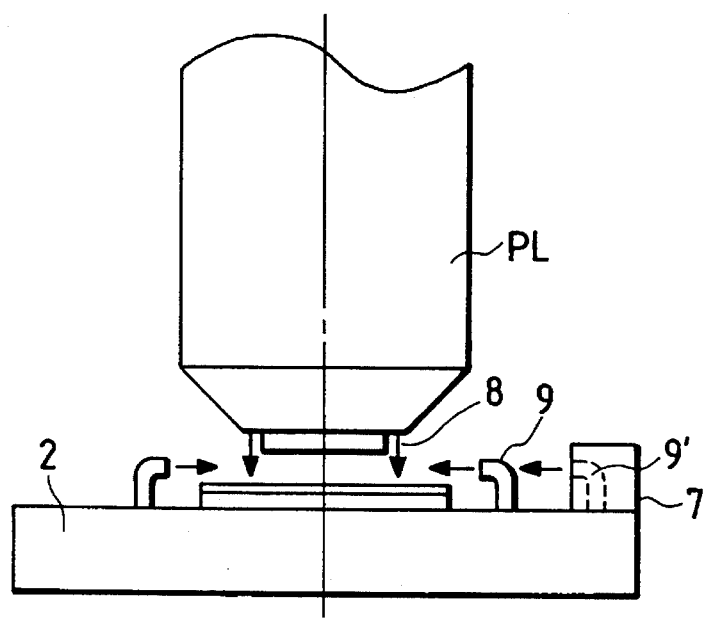
FIG. 4A and FIG. 4B are drawings to show paths of inert gas supplied between the projection optical system and a wafer, and a layout of feed ports.
Figure 4B:
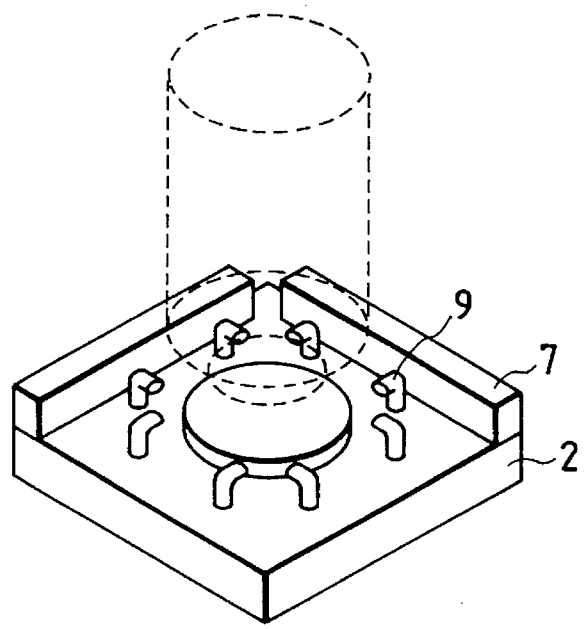

FIG. 4A and FIG. 4B are drawings to show paths of nitrogen gas supplied to the space between the projection optical system PL and the wafer W, and the layout of feed ports. In the present embodiment, there are a plurality of supply outlets 8, of a first gas emitting member for example circumferentially arranged at the lower end portion of projection optical system PL. The nitrogen gas is supplied toward the wafer W through the supply outlets 8 along the optical axis of projection optical system PL, that is, in the direction nearly perpendicular to the surface of wafer W.

Additionally, there are a plurality of other supply outlets 9 of a second gas emitting member provided on the wafer table 2. The nitrogen gas is also supplied through the supply outlets 9 in the direction nearly parallel to the surface of wafer W. As shown in FIG. 4B, the supply outlets 9 may be circumferentially arranged on the wafer table 2 to supply the nitrogen gas radially toward the optical axis of projection optical system PL. Alternatively, supply outlets 9' may be set inside the X-direction interference mirror 7X and the Y-direction interference mirror 7Y located on the wafer table 2 to avoid mechanical interference between the supply outlets and the wafer upon exchange of wafers W.

In the exposure apparatus as so arranged according to the embodiment of the present invention, the receptacles housing the illumination optical system IL, the projection optical system PL and the reticle R1 are successively evacuated to vacuum by operation of rotary pump RP through the associated valves V3, V4 and V8. The degree of vacuum inside each receptacle can be known based on the density of oxygen detected by the associated oxygen sensor S. After a desired vacuum state is attained, the nitrogen gas is supplied through the valves V1 and V2 into the receptacles housing the illumination optical system IL and the projection optical system PL, respectively, up to a pressure above the atmospheric pressure. Also, suitably ionized nitrogen gas is supplied through the valve V5 into the receptacle housing the reticle R1 up to a pressure over the atmospheric pressure. The ionized nitrogen gas works to remove the static electricity appearing on the reticle R1, whereby the reticle R1 can be prevented from being damaged due to the static electricity.

Also, the ionized nitrogen gas of above the atmospheric pressure is supplied toward the wafer W through the valve V6 and the supply outlets 8 formed at the lower end portion of projection optical system PL in the direction nearly perpendicular to the wafer W between the projection optical system P1 and the wafer W. Further, the ionized nitrogen gas of above the atmospheric pressure is also supplied through the valve V7 and the supply outlets 9 provided on the wafer table 2 in wafer stage WS nearly in parallel with and over the wafer W. The ionized nitrogen gas works to remove the static electricity appearing on the wafer W, whereby the wafer W can be prevented from being damaged or contaminated due to the static electricity.

The ionized nitrogen gas is almost continuously supplied to the space between the projection optical system PL and the wafer W during projection exposure of the wafer and during exchange of wafers. Thus, the nitrogen gas atmosphere will not be substantially broken even in exchange of wafers. Since there will normally occur no such chance that components are exchanged inside the receptacles housing the illumination optical system IL and the projection optical system PL, no additional nitrogen gas needs to be supplied after the nitrogen gas is initially introduced thereinto. In contrast, only if a reticle R is exchanged for another in the receptacle housing the reticle R, the receptacle needs to be again evacuated to vacuum after exchange of reticles and the ionized nitrogen gas needs to be supplied thereinto.

As described above, the present embodiment is an exposure apparatus the exposure wavelength of which overlaps with the absorption spectrum of oxygen, in which the nitrogen gas is continuously supplied to the space between the final member in the projection optical system and the wafer along the directions perpendicular to and parallel to the wafer surface. Accordingly, the projection exposure can be performed in the inert gas atmosphere of the same substitution rate as that in case of an arrangement in which a receptacle houses the entire area from the lower end of the projection optical system to the wafer stage and the atmosphere is substituted by inert gas. Incidentally, the present Inventors confirmed that if the nitrogen gas was supplied only in the direction perpendicular to the wafer surface, the oxygen density in the exposure area was about 10%, while the oxygen density was decreased to about 1% by supplying the nitrogen gas in the two directions as in the present invention.

The wafer table is normally provided with a vacuum suction and removing gas mechanism for a wafer, designated diagrammatically by valve VSR in FIG. 1. Accordingly, if the gas used for removing the wafer is the same inert gas as one used in the present invention, the pipe arrangement of the gas circulating system can be simplified.

Further, the present embodiment is an example of exposure apparatus which employs as exposure light the light in the wavelength range of below 200 nm using the ArF laser, but it is clear that the present invention can be effectively applied regardless of the exposure wavelength to cases using resists of a type apt to be easily damaged by the oxygen atmosphere in exposure, without departing from the scope of the invention.

Next described is a modification of the present invention.

An apparatus of the present modification has substantially the same structure a the apparatus in FIG. 1 except that the receptacle housing the reticle R1 is different in structure.

Figure 5:
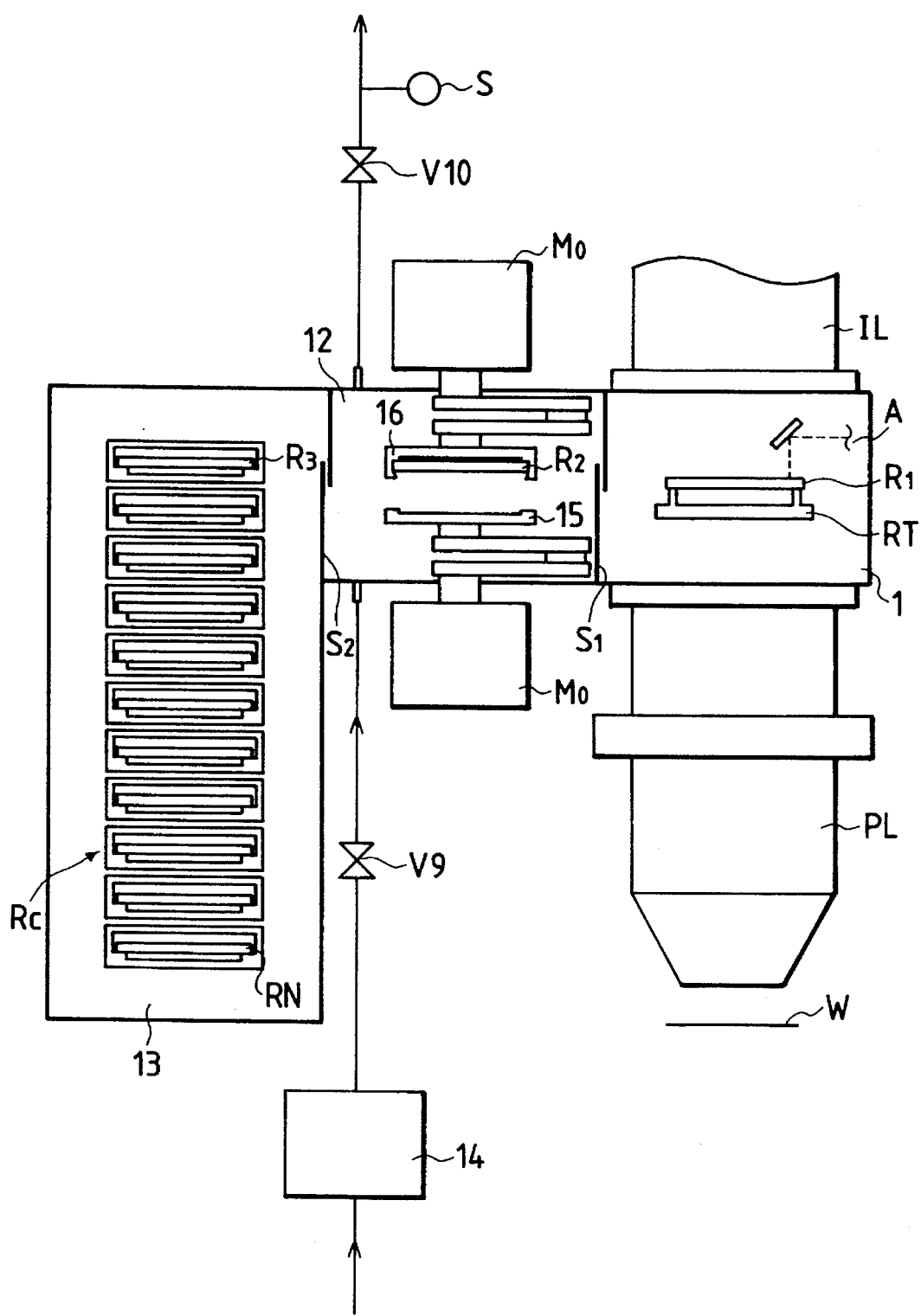
FIG. 5 is a drawing to schematically show the structure of a reticle portion in FIG. 1.
Figure 6:
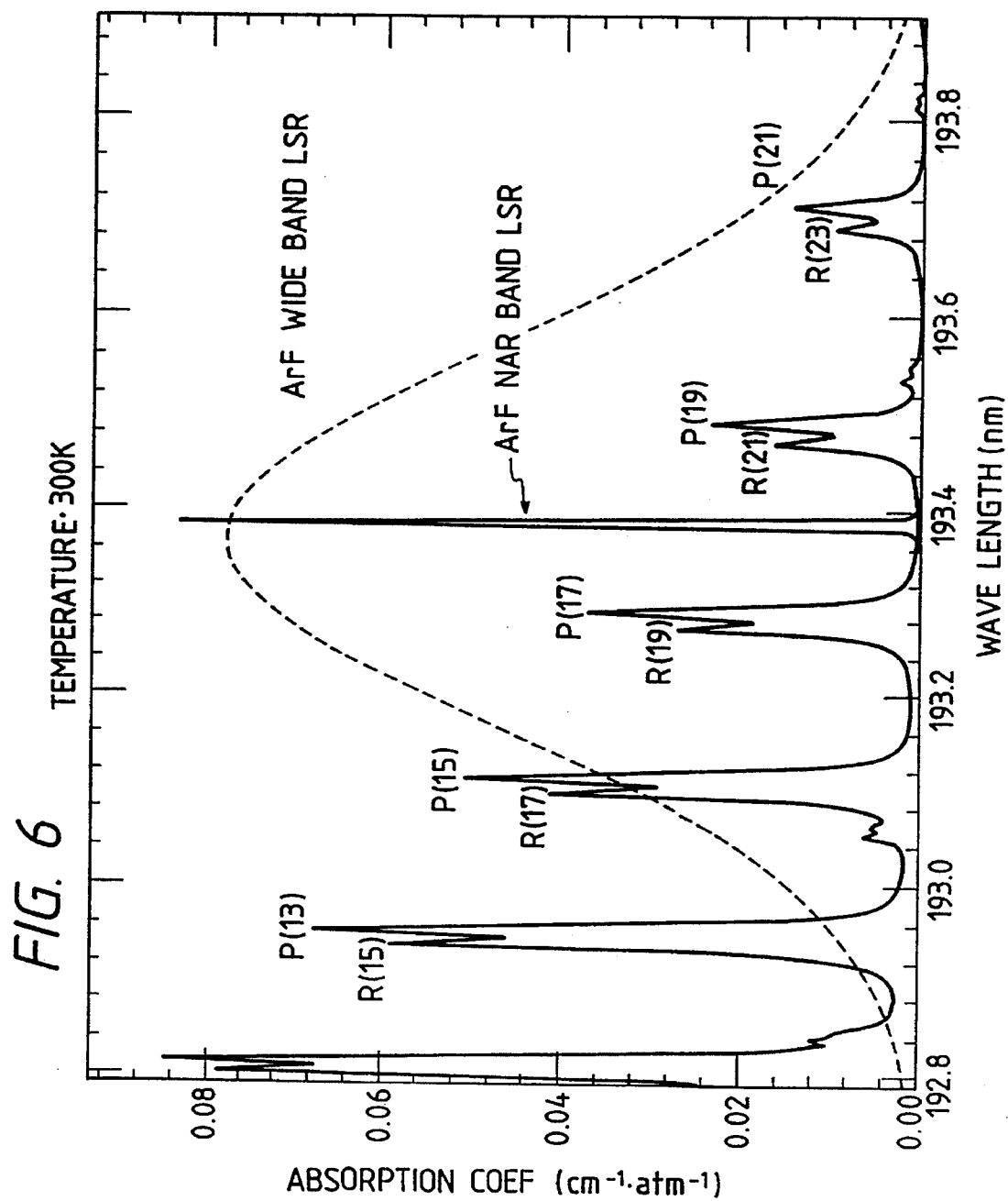
FIG. 6 is a drawing to show an absorption spectrum of oxygen.

FIG. 5 is a drawing to schematically show the structure of a reticle section in the exposure apparatus of FIG. 1. As shown in FIG. 5, the apparatus of the present modification is provided with a first chamber 1 for hermetically confining a first reticle R1 to be subjected to projection exposure. In the first chamber 1, the reticle R1 is positioned on a reticle table RT by operation of an alignment unit A. The apparatus as shown has a second chamber 12 adjacent to the first chamber 1. The first chamber 1 and the second chamber 12 are separated from each other by a mechanical shutter S1 (first open and close mechanism) which can be opened or closed. There are two arms 15, 16 of a reticle carrying (exchanging) mechanism Mo set in the second chamber 12. In FIG. 5, the first arm 15 (exchanging member) is grasping nothing, but the second arm 16 (exchanging member) is grasping a reticle R2 to be next subjected to projection exposure in the stand-by state.

As described previously, the first chamber 1 is connected through the associated valves to the exhaust system and to the gas feed system, while the ionized nitrogen gas is supplied to the second chamber 12 through a valve V9 and an ionized gas generator 14. The ionized gas generator 14 ionizes the nitrogen gas for example by the two-photon absorption effect under irradiation of ultraviolet light. Also, the second chamber 12 communicates with an exhaust duct through a valve V10, an oxygen sensor S and a rotary pump.

Further, a third chamber 13 is adjacent to the second chamber 12 with a second shutter S2 (second open and close mechanism); inbetween.

A reticle cassette storage means (reticle library) RC is provided for storing a plurality of reticles inside the third chamber 13. Reticles R3 to RN to be consecutively subjected to projection exposure are set in the reticle cassette RC.

In the exposure apparatus as so arranged according to the modification of the present invention, the first chamber 1 and the second chamber 12 are initially in the atmosphere and the shutters S1 and S2 are open at the start of the operation of apparatus. Then, the first and second arms 15, 16 of carrying mechanism Mo are activated to grasp respective reticles R1 and R2 in the reticle cassette RC inside the third chamber 13 and to take them out therefrom. The first arm 15 grasping the reticle R1 passes through the second chamber 12, goes into the first chamber 1 to set the reticle R1 on the reticle table RT, and then returns to the second chamber 12. On the other hand, the second arm 16 grasping the reticle R2 returns to the second chamber 12 and goes into a stand-by state without going into the first chamber 1.

After the first and second arms 15, 16 leave the third chamber 13 while grasping the respective reticles R1 and R2, the shutter S2 is closed. After the reticle R1 is carried into the first chamber 1 and the first arm 15 leaves the first chamber 1, the shutter S1 is closed. When the shutters S1 and S2 are closed, the first chamber 1 and the second chamber 12 are separately evacuated to vacuum. Then, the nitrogen gas is introduced into the first chamber 1 and the properly ionized nitrogen gas into the second chamber 12. The filling pressure is set over the atmospheric pressure, and the filling pressure of the second chamber 12 is set higher than that of the first chamber 1.

When the first chamber 1 is filled with nitrogen gas to establish a desired inert gas atmosphere, the alignment unit A is actuated to position the reticle R1 on the reticle table RT. After the positioning of reticle R1, the specific projection exposure is carried out. Namely, a circuit pattern formed on the reticle R1 is transferred onto each exposure area in the wafer W.

After the projection exposure is finished on the reticle R1, the shutter S1 is opened and the carrying mechanism Mo is actuated to exchange the exposed reticle R1 for reticle R2 to be next exposed. Specifically, the first arm 15 goes into the first chamber 1 to grasp the exposed reticle R1 and then carries it into the second chamber 12, and then the second arm 16 grasping the reticle R2 to be next exposed goes into the first chamber 1 to set the reticle R2 on the reticle table RT. The shutter S1 is closed after the reticle R2 is set on the reticle table RT and the second arm 16 leaves the first chamber 1 to return to the second chamber 12.

The ionized nitrogen in the second chamber 12 flows into the first chamber 1 in a period between the opening and the closure of the shutter S1, but the inert gas atmosphere in the first chamber 1 is not substantially broken and little flow of the atmosphere occurs. Accordingly, the positioning of reticle R2 can be carried out immediately after the shutter S1 is closed, and the specific projection exposure can be started.

On the other hand, the shutter S2 is opened immediately after the shutter S1 is closed. Then, the first arm 15 grasping the exposed reticle R1 goes into the third chamber 13 to return the reticle R1 to a predetermined position in the reticle cassette RC. At the same time, the second arm 16 also goes into the third chamber 13 to grasp another reticle R3 for next exposure to be kept in the stand-by state in the second chamber 12 and then carries it into the second chamber 12.

The shutter S2 is closed after the first arm 15 and the second arm 16 grasping the reticle R3 return into the second chamber 12. When the shutter S2 is closed, the second chamber 12 is evacuated to vacuum and the properly ionized nitrogen gas is introduced thereinto up to a pressure above the atmospheric pressure to re-establish the desired inert gas atmosphere. The re-establishment of the inert gas atmosphere in the second chamber 12 is carried out during the projection exposure of reticle R2.

Repeating the above steps, the projection exposure can be consecutively conducted while exchanging the reticles without substantially breaking the inert gas atmosphere in the first chamber 1.

The present modification is so arranged that the ionized inert gas atmosphere is formed in the second chamber 12 and in the first chamber 1 (gradually after the first reticle exchange). The reticle cassette RC and the reticles R are apt to be easily charged in the washing step and in the carrying step, so that the static electricity could break the circuit pattern on the reticle. In the present modification, the ionized inert gas works to neutralize the charge so as to remove the static electricity on the reticle, whereby the circuit pattern on the reticle can be prevented from being damaged due to the static electricity.

Although the present modification is arranged to have the third chamber 13 kept in the atmosphere, it is conceivable that the third chamber 13 may be connected to an exhaust system and to a gas feed system to establish the inert gas atmosphere in the third chamber 13.

Also, although the present modification was an example having the carrying mechanism of two arms, it is clear that the exchange operation of reticles can be performed by a single arm if a table for receiving a reticle is set inside the second chamber 12.

Further, the embodiment and the modification are examples in which the nitrogen gas is used as the inert gas, but another inert gas, for example helium gas, may be used as long as it has an exposure wavelength region not overlapping with the absorption spectrum of oxygen. Also, the present invention and the present modification can be effectively applied to any of a reflection type projection optical system, a catadioptric projection optical system, and a refraction-type projection optical system.

What is claimed is:

1. An exposure apparatus for illuminating a pattern of a mask by an illumination optical system to transfer said pattern of the mask onto a photosensitive substrate set on a movable stage through a projection optical system, comprising:

a radiation source that generates an ultraviolet radiation having an emission spectral band overlapping with an absorption spectral region of oxygen in order to illuminate the mask through said illumination optical system;

a first gas emitting member that emits an inert gas toward said photosensitive substrate substantially in parallel with an optical axis of said projection optical system in a space formed between said projection optical system and said photosensitive substrate;

a second gas emitting member that emits the inert gas toward said space in a direction intersecting with said optical axis so as to establish an inert gas atmosphere almost lacking oxygen in said space; and a gas supplying system that distributes said inert gas, which has essentially no absorption spectrum at least in the emission spectral band of said ultraviolet radiation, to said first and second gas emitting members;

wherein said transfer is performed in said inert gas atmosphere.

2. An exposure apparatus according to claim 1, wherein a pressure of the inert gas emitted from each of said first and second emitting members is over atmospheric pressure.

3. An exposure apparatus according to claim 1, wherein said second emitting member emits the inert gas in a direction perpendicular to said optical axis of the projection optical system.

4. An exposure apparatus according to claim 1, wherein said second emitting member emits the inert gas radially toward said optical axis of the projection optical system.

5. An exposure apparatus according to claim 1, wherein said first emitting member is provided with a plurality of supply outlets toward said movable stage in the vicinity of an end portion of said projection optical system and said second emitting member is provided with a plurality of outlets on said movable stage so as to surround the photosensitive substrate set on said movable stage.

6. An exposure apparatus according to claim 5, further comprising a laser interferometer system for monitoring a position of said movable stage, wherein said interferometer system comprises:

interference mirrors provided along two perpendicular sides of said stage thereon;

interferometer units opposed to said respective interference mirrors to emit beams toward said respective interference mirrors; and wherein said supply outlets of the second emitting member are arranged inside a portion of said respective interference mirrors on said stage.

7. An exposure apparatus according to claim 1, wherein said inert gas emitted from said first and second gas emitting member is ionized and wherein said ionized inert gas removes static electricity appearing on said photosensitive substrate.

8. An exposure apparatus according to claim 1, wherein said gas supply system includes an ionizer to ionize said inert gas with ultraviolet rays.

9. An exposure apparatus according to claim 8, wherein said inert gas supplied from said gas supply system is nitrogen gas.

10. An exposure apparatus according to claim 8, wherein said ionizer comprises a gas flow cell in which said inert gas is irradiated by ultraviolet rays supplied from a radiation source.

11. An exposure apparatus according to claim 1, wherein said photosensitive substrate is set on the stage by supplying a vacuum suction to said stage and is taken away from the stage by supplying a removing gas to said stage;

wherein said removing gas and said inert gas are supplied from a common supply source.

12. An exposure apparatus for transferring a pattern of a mask irradiated by an illumination optical system onto a photosensitive substrate through a projection optical system comprising:

a radiation source that generates a radiation beam having an emission spectral band overlapping with an absorption spectral region of oxygen in order to irradiate a mask through said illumination optical system;

a first chamber for hermetically housing a first mask placed above said projection optical system for projection exposure;

a first gas injection system that fills said first chamber with an inert gas;

an exchanging mechanism for exchanging said first mask with a second mask;

a second chamber adjacent to said first chamber for hermetically housing said second mask;

a second gas injection system that fills said second chamber with an inert gas;

an open and close mechanism that enables communication between said first chamber and said second chamber at an operation time of said exchanging mechanism; and a gas supplying system that distributes said inert gas, which has essentially no absorption spectrum at least in the emission spectral band of said radiation beam, to said first and second gas injection systems in order to establish an inert gas atmosphere almost lacking oxygen in said chambers.

13. An exposure apparatus according to claim 12, wherein said second gas injection system injects an ionized inert gas in said second chamber to remove static electricity appearing on a mask.

14. An exposure apparatus according to claim 13, wherein a pressure of said ionized inert gas in said second chamber is higher than that of the inert gas in said first chamber; and wherein during communication between said first chamber and said second chamber, said ionized inert gas flows into said first chamber to remove static electricity appearing on the first mask in said first chamber.

15. An exposure apparatus according to claim 12, wherein said exchanging mechanism is disposed in said second chamber.

16. An exposure apparatus according to claim 15, wherein said exchanging mechanism comprises:

a first movable arm for carrying said first mask into said second chamber; and a second movable arm for carrying said second mask into said first chamber.

17. An exposure apparatus according to claim 15, wherein said exchanging mechanism comprises:

a movable arm for carrying a mask between said first chamber and said second chamber; and a table provided in said second chamber for a mask to be mounted thereon.

18. An exposure apparatus according to claim 12, further comprising:

storage means for storing a plurality of masks;

a third chamber for hermetically housing said storage means;

an exchanging member for exchanging the second mask in said second chamber with a mask in said third chamber; and a second open and close mechanism for enabling communication between said third chamber and said second chamber.

19. An exposure apparatus according to claim 18, further comprising a third gas injection system for supplying an inert gas to said third chamber.

20. An exposure apparatus according to claim 19, wherein said third gas injection system injects an ionized inert gas to remove static electricity appearing on the masks stored in said third chamber.

21. A projection exposure method for exposing a pattern of a mask onto a photosensitive substrate through a projection optical system, the method comprising the steps of:

providing an ArF excimer laser emitting an ultraviolet radiation which has a spectral band narrowed so as to avoid absorption spectrum lines of oxygen;

providing an inert gas atmosphere comprising nitrogen gas in which oxygen density is less than 10% at least in a space of a projection path between said projection optical system and the substrate; and irradiating the mask with the ultraviolet radiation emitted from said ArF excimer laser to project a pattern image of the mask onto the substrate through said projection optical system and said inert gas atmosphere.

22. A projection exposure method according to claim 21, wherein said nitrogen gas is ionized to remove static electricity appearing on the substrate.

23. A projection exposure method according to claim 21, wherein said providing of the inert gas atmosphere is carried out by first gas outlets emitting nitrogen gas toward the substrate substantially in parallel with an optical axis of said projection optical system and second gas outlets emitting nitrogen gas toward said optical axis of the projection optical system substantially in parallel with the substrate.

24. A projection exposure method according to claim 21, further comprising:

providing an inert gas atmosphere in an entire space surrounding an optical path from said mask to an end portion of said projection optical system by filling said entire space with nitrogen gas after vacuum evacuation of said entire space.

* * * * *